United States Patent [19]

Stepan

[11] Patent Number: 4,508,754
[45] Date of Patent: Apr. 2, 1985

[54] METHOD OF ADDING FINE LINE CONDUCTIVE/RESISTIVE PATTERNS TO A THICK FILM MICROCIRCUIT

[75] Inventor: William E. Stepan, Clarendon Hills, Ill.

[73] Assignee: GTE Automatic Electric Inc., Northlake, Ill.

[21] Appl. No.: 409,673

[22] Filed: Aug. 19, 1982

[51] Int. Cl.³ .............................................. B05D 5/12
[52] U.S. Cl. ................................. 427/53.1; 427/96; 427/264; 427/265; 427/266; 427/275; 427/292; 427/376.3; 427/383.5
[58] Field of Search ............... 427/53.1, 96, 97, 264, 427/265, 266, 275, 292, 376.3, 383.5; 29/846, 851

[56] References Cited

U.S. PATENT DOCUMENTS

| | | | |
|---|---|---|---|
| 3,240,624 | 3/1966 | Beck | 427/96 X |
| 3,392,052 | 7/1968 | Davis | 427/96 |
| 3,669,733 | 6/1972 | Allington | 427/53.1 |
| 4,020,206 | 4/1977 | Beil | 427/383.3 X |
| 4,081,653 | 7/1978 | Koo et al. | 427/96 X |
| 4,119,480 | 10/1978 | Nishi et al. | 427/96 X |
| 4,191,789 | 5/1980 | Brown | 427/380 X |
| 4,270,823 | 6/1981 | Kuznetzoff | 427/387 X |
| 4,336,320 | 6/1982 | Cummings et al. | 427/96 X |

Primary Examiner—Richard Bueker
Attorney, Agent, or Firm—Anthony Miologos; Peter Xiarhos

[57] ABSTRACT

A method of adding fine line circuits to a thick film microcircuit comprising the steps of: cutting a circuit pattern on a substrate; filling the circuit pattern with a conductive or resistive paste and removing the excess; adding screen printing thick film circuit elements on the substrate surface and over selected portions of the fine line pattern; and heating thereby sintering the paste and thick film elements to the substrate.

6 Claims, 2 Drawing Figures

METHOD OF ADDING FINE LINE CONDUCTIVE/RESISTIVE PATTERNS TO A THICK FILM MICROCIRCUIT

CROSS REFERENCE TO RELATED APPLICATIONS

This application is related to Applicant's copending United States Patent Applications, titled "Method of Producing Fine Line Conductive/Resistive Patterns on a Film Substrate", Ser. No. 409,674, filed Aug. 19, 1982 and "Method of Producing Fine Line Conductive/Resistive Patterns on an Insulating Coating, Ser. No. 409,672, filed Aug. 19, 1982, all having a common assignee.

BACKGROUND OF THE INVENTION

(1) Field of the Invention

This invention relates in general to the manufacture of thick film microcircuits and more particularly to a new method of adding fine line conductive/resistive patterns to a thick film microcircuit.

(2) Description of the Prior Art

Thick film microcircuits requiring high density circuit packaging and compatibility with integrated circuit leads require circuit patterns with conductive elements as small as 2 mils wide (0.002 inch). The conventional method of screen printing thick film patterns on a film substrate cannot consistently produce patterns with element widths less than 5 to 10 mils. Photolithographic techniques have been used to produce thick film patterns with 2 mil wide conductors, but the process is somewhat complicated and costly.

The conventional method used to produce thick film circuit patterns is to apply conductive and/or resistive "inks" onto a ceramic substrate through a prepared pattern on a wire mesh or stencil. The deposited ink pattern and substrate are "fired" in a furnace to remove the solvents from the paste and sinter the material to the ceramic base. The reproduction of fine images on a screen or stencil is difficult to achieve compounded by the tendency for thick film paste to "slump" or run after it has been printed. These two conditions combine to limit the practical minimal width and spacing of the printed elements on film circuits to 5 to 10 mils.

SUMMARY OF THE INVENTION

The new method for adding fine line conductive/resistive patterns on thick film microcircuits includes, preparing a suitable dielectric substrate by incising the desired fine line circuit pattern on the substrate surface, applying the desired conductive or resistive paste over the pattern and wiping the excess off. To assure complete removal of the paste from the surface a light abrading or a lapping of the surface can be performed before or after the "firing" of the circuit. After the initial fine line pattern has been applied to the substrate wide line circuit elements can now be added by the conventional techniques of printing or screening. Any method of producing the fine line pattern on the substrate may be employed. For example, the preferred method would use conventional laser technology to cut the fine line patterns on the appropriate substrate.

BRIEF DESCRIPTION OF THE DRAWINGS

A better understanding of the invention can be had from the consideration of the following detailed description taken in conjunction with the accompanying drawings in which.

DESCRIPTION OF THE PREFERRED EMBODIMENT

Figure 1:
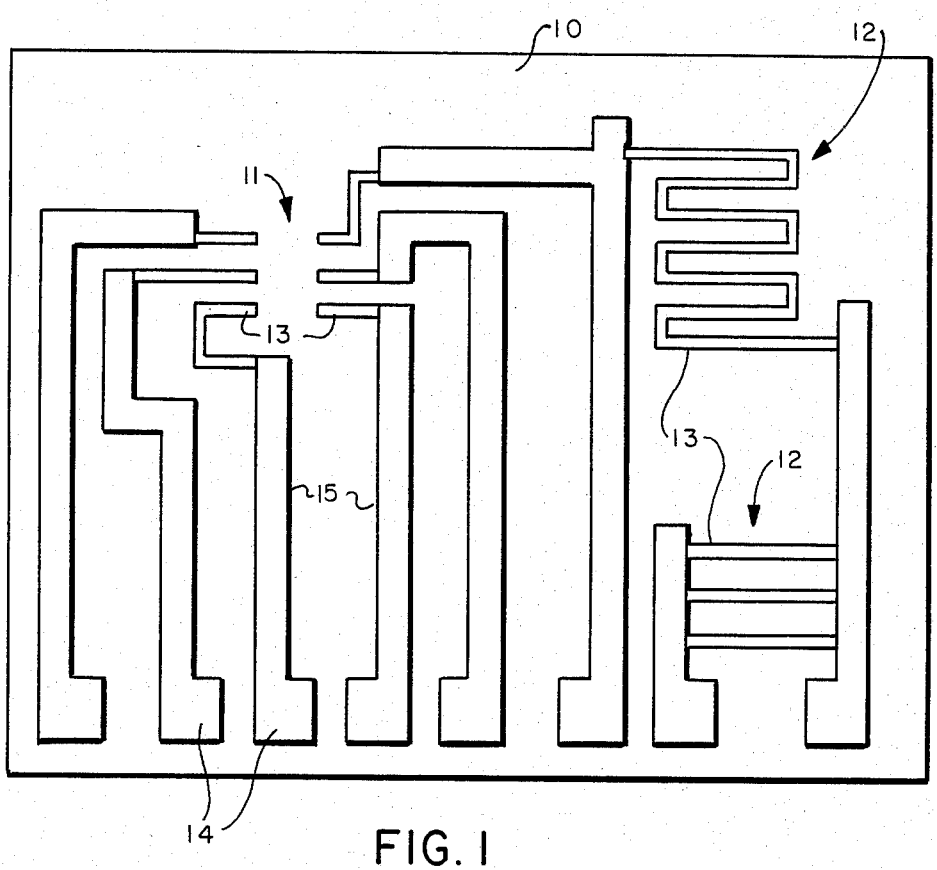
FIG. 1 is a plan view of a microcircuit having in combination conventional thick film and fine line conductive/resistive patterns on the appropriate substrate in accordance with the present invention.
Figure 2:
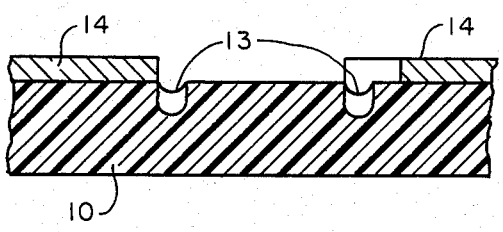
FIG. 2 is a section through the fine line pattern and substrate in accordance with the present invention.

Turning now to FIGS. 1 and 2 of the drawings, the method of producing fine line circuit patterns on a substrate will be described.

An appropriate dielectric substrate 10 has a fine line conductive or resistive pattern 11 and 12 respectively formed on it by cutting, abrading or laser engraving channels 13 forming the pattern on the dielectric substrate surface. The desirability of the laser as an engraving tool makes its use a viable and preferred technique for forming the fine line pattern. Additionally, since the lasers vaporizing beam can be precisely controlled the pattern can be more precisely cut. Another method would be to direct a fine stream of sandblasting particles forming the fine line patterns by mechanical abrasion.

After the pattern has been cut on the dielectric substrate the appropriate conductor or resistive paste is spread over the surface and allowed to fill the fine line channels 13. It will be appreciated by those skilled in the art that the applied patterns may be of various configurations. For example, in FIG. 1 fine line pattern 11 provides conductive traces to a packaged integrated circuit element and thus is filled with an appropriate conductive paste. Fine line pattern 12 forms a resistive network and an appropriate resistive paste would be used to fill the pattern.

After the patterns have been filled with the appropriate paste the substrate surface is wiped clean and a light abrading or lapping of the surface is performed to ensure the complete removal of the paste from the surface. Conventional thick film elements such as conductor paths 13 and contact pads 14 may then be applied to the substrate surface employing a conventional screening technique. Selected portions of the fine line circuit pattern have the thick film elements applied to them connecting the fine line patterns to other circuit elements of the substrate or to outboarded circuits. The substrate is then processed like a conventional screen circuit with the substrate "fired" in a furnace to remove the solvents from the paste and sinter the fine line pattern and thick film elements to the substrate.

Although the best mode contemplated for carrying out the present invention has been herein shown and described it will be apparent that modifications and variations may be made without departing from what is regarded as the subject matter of the invention.

What is claimed is:

1. The method of adding fine line circuits to a thick film microcircuit comprising the steps of;
    providing a dielectric substrate surface;
    forming an engraved circuit pattern on said dielectric substrate surface by directing engraving means to cut and remove selected portions of said dielectric substrate surface;
    applying a circuit medium over said engraved pattern;

wiping said circuit medium off of said dielectric substrate surface leaving said engraved pattern filled with said circuit medium;

screen printing thick film circuit elements on said dielectric substrate surface and over selected portions of said engraved circuit pattern; and heating said substrate, to cause said circuit medium and said thick film elements to be sintered to said substrate establishing said thick film microcircuit.

2. The method according to claim 1, wherein said circuit medium is an electrically conductive paste, disposed to form electrically conductive circuit patterns.

3. The method according to claim 1, wherein said circuit medium is an electrically resistive paste disposed to form electrically resistive circuit patterns.

4. The method according to claim 3, wherein said engraving means includes directing a laser beam to form said pattern.

5. The method according to claim 4, wherein said engraving means includes directing a sandblasting stream to form said circuit pattern.

6. The method according to claim 4, wherein said engraving means includes directing engraving tools to form said circuit pattern.

* * * * *